(12) United States Patent
Kuo et al.

(10) Patent No.: US 6,620,694 B1
(45) Date of Patent: *Sep. 16, 2003

(54) METHOD OF MAKING NON VOLATILE MEMORY WITH A PROTECTIVE METAL LINE

(75) Inventors: Tung-Cheng Kuo, Yilan Hsien (TW); Chien-Hung Liu, Taipei (TW); Shyi-Shuh Pan, Kaohsiung (TW); Shou-Wei Huang, Chilung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/128,716

(22) Filed: Apr. 23, 2002

(30) Foreign Application Priority Data

Mar. 20, 2002 (TW) .......................... 91105280 A

(51) Int. Cl.⁷ .......................................... H01L 21/8247
(52) U.S. Cl. ........................................ 438/287; 438/292
(58) Field of Search .............................. 438/216, 261, 438/287, 288, 292, 466, 468, 469, 954

(56) References Cited

U.S. PATENT DOCUMENTS

| | | | | |
|---|---|---|---|---|
| 6,277,691 B1 | * | 8/2001 | Quoc et al. | 438/261 |
| 6,337,502 B1 | * | 1/2002 | Eitan et al. | 257/357 |
| 6,417,053 B1 | * | 7/2002 | Kuo | 438/292 |
| 6,469,342 B1 | * | 10/2002 | Kuo et al. | 257/357 |

* cited by examiner

Primary Examiner—Chandra Chaudhari
(74) Attorney, Agent, or Firm—J.C. Patents

(57) ABSTRACT

A non-volatile memory and the fabrication thereof are described. The non-volatile memory comprises a word-line on a substrate, a charge trapping layer between the word-line and the substrate, and a contact electrically connecting with the word-line over the substrate. In addition, there is a protective metal line electrically connecting with the word-line and with a grounding doped region in the substrate via different contacts, respectively. The protective metal line has a resistance higher than that of the word-line.

7 Claims, 2 Drawing Sheets

METHOD OF MAKING NON VOLATILE MEMORY WITH A PROTECTIVE METAL LINE

CROSS-REFERENCE TO RELATED APPLICATION

This application claims the priority benefit of Taiwan application serial no. 91105280, filed Mar. 20, 2002.

BACKGROUND OF THE INVENTION

1. Field of Invention

The present invention relates to a structure of a semiconductor device and the fabrication thereof. More particularly, the present invention relates to a structure of a non-volatile memory (NVM) and the fabrication thereof.

2. Description of Related Art

Plasma techniques are frequently used in a manufacturing process of a non-volatile memory having a charge trapping layer for data storage. However, when a transient charge unbalance occurs in the plasma, some charges will move along the metal portions on the wafer. Such an effect is called the antenna effect. Consequently, some charges are injected into the charge trapping layers of the non-volatile memory to unevenly raise the threshold voltages ($V_T$) of the memory cells, i.e., to produce a programming effect. Therefore, the $V_T$ distribution of the non-volatile memory is much broadened, being usually from 0.3V to 0.9V.

In order to prevent the programming effect caused by the antenna effect, a diode is formed in the substrate to electrically connect with the word-line in the prior art. When the charges accumulated on the word-line reach a certain amount to produce a voltage higher than the breakdown voltage of the diode, the charges are released in a breakdown manner. However, the programming effect cannot be completely eliminated by this method since there may still be some charges injected into the charge trapping layer even if the voltage produced by the charges accumulated on the word-line is lower than the breakdown voltage of the diode. Moreover, by using this method, the input voltage of the non-volatile memory will be lowered by the diode to adversely decrease the operating speed of the memory device.

SUMMARY OF THE INVENTION

Accordingly, this invention provides a non-volatile memory and the fabrication thereof to prevent the charge trapping layer of a non-volatile memory from being damaged in a plasma process.

This invention also provides a non-volatile memory and the fabrication thereof to prevent the non-volatile memory from being programmed in a plasma process, so that the threshold voltages ($V_T$) of the memory cells are not raised and the $V_T$ distribution is not broadened.

This invention also provides a non-volatile memory and the fabrication thereof to avoid the input voltage of the memory device from being lowered, so that the operating speed of the memory device is not decreased.

The non-volatile memory of this invention comprises a word-line on a substrate, a charge trapping layer between the word-line and the substrate, and a contact electrically connecting with the word-line over the substrate. In addition, there is a protective metal line electrically connecting with the word-line and with a grounding doped region in the substrate via two contacts, respectively. The protective metal line has a resistance higher than that of the word-line.

In the method of fabricating a non-volatile memory of this invention, a non-volatile cell is formed on a substrate and then a grounding doped region is formed in the substrate. Two contacts are then formed over the substrate to electrically connect with the word-line and the grounding doped region, respectively. A protective metal line is formed over the substrate to electrically connect with the grounding doped region and with the word-line via the two contacts, respectively. The protective metal line has a resistance higher than that of the word-line so that the protective metal line can be blown by applying a large current when the manufacturing process is completed.

Because this invention uses a protective metal line with a high resistance to conduct the charges produced in a plasma process into the substrate, the charge trapping layer of the non-volatile memory is not damaged and the memory cells are not programmed at random. Moreover, since the protective metal line has a high resistance, it can be easily blown by applying a large current to disconnect the word-line from the grounding doped region when the manufacturing process is completed. Consequently, the input voltage of the memory device is not lowered and the operating speed of the memory device is not decreased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
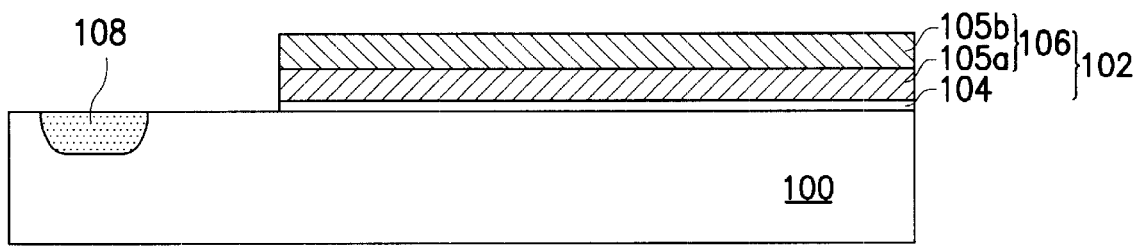
FIGS. 1A~1C illustrate a process flow of fabricating a non-volatile memory according to a preferred embodiment of this invention in a cross-sectional view.

Refer to FIG. 1A, a non-volatile memory cell 102 is formed on a substrate 100, wherein the non-volatile memory cell 102 includes a charge trapping layer 104 and a word-line 106 thereon. The charge trapping layer 104 comprises, for example, a silicon oxide/silicon nitride/silicon oxide (ONO) composite layer, while the non-volatile memory having such a composite layer is called the nitride read-only memory (NROM). The word-line 106 may be a composite conductive layer comprising a polysilicon line 105a and a metal silicide line 105b thereon, wherein the metal silicide line 105b comprises, for example, silicon tungsten ($WSi_x$). The non-volatile memory cell 102 may be fabricated by forming sequentially a charge trapping layer, a polysilicon layer, and a metal silicide layer on the substrate 100, patterning the three layers to form the word-line 106 and then forming a source/drain (not shown) in the substrate 100. Thereafter, a grounding doped region 108 is formed in the substrate 100 by ion implantation.

Figure 1B:
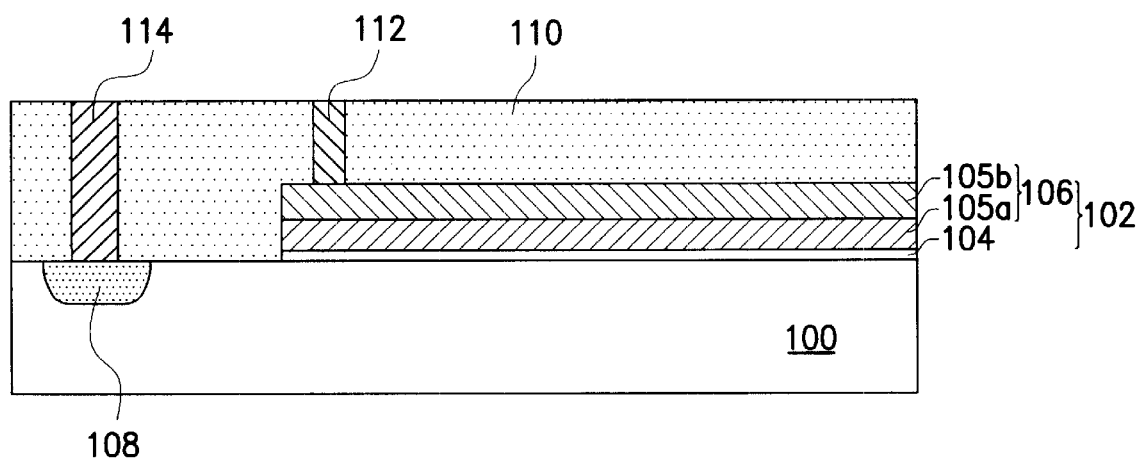

Refer to FIG. 1B, a dielectric layer 110 is formed over the substrate 100 and then two contacts 112 and 114 are formed in the dielectric layer 110 electrically connecting with the word-line 106 and the grounding doped region 108, respectively. The dielectric layer 110 comprises, for example, borophosphosilicate glass (BPSG).

Figure 1C:
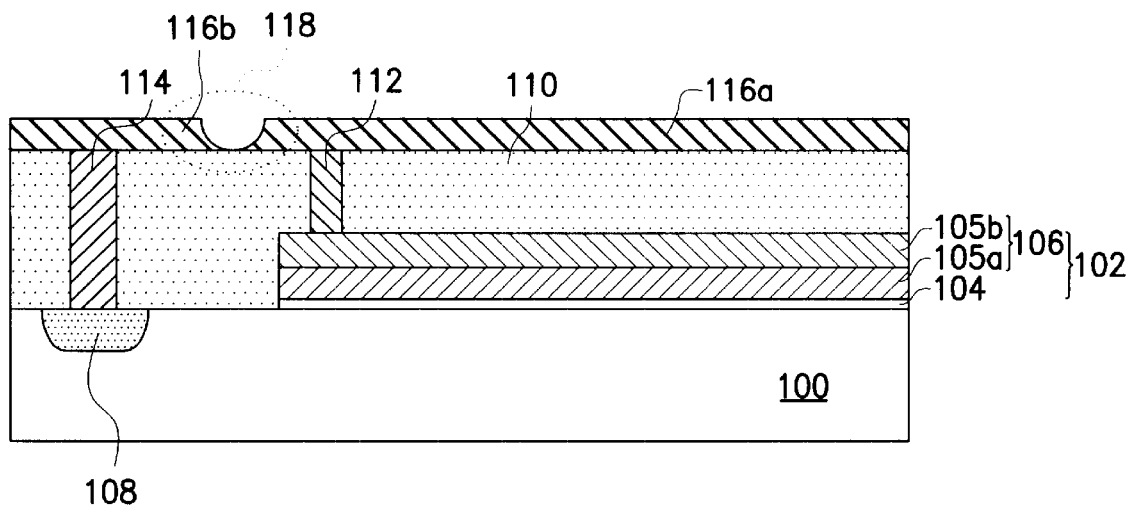

Refer to FIG. 1C, a metal interconnect 116a and a protective metal line 116b connecting with the metal interconnect 116a are formed over the substrate 100, wherein the protective metal line 116b has a resistance higher than that of the word-line 106. The metal interconnect 116a is electrically connected to the word-line 106 via the contact 112 and the protective metal line 116b is electrically connected with the grounding doped region 108 via the contact 114. The protective metal line 116b is, for example, narrower than the word-line 106 in order to have a high resistance. The protective metal line 116b can be formed by, for example, forming a metal layer over the substrate 100 and then patterning the metal layer. Since the protective metal line 116b has a high resistance, it can be easily blown by applying a large current to form a gap 118 disconnecting the word-line 106 from the grounding doped region 108 when the manufacturing process is completed.

Figure 2:
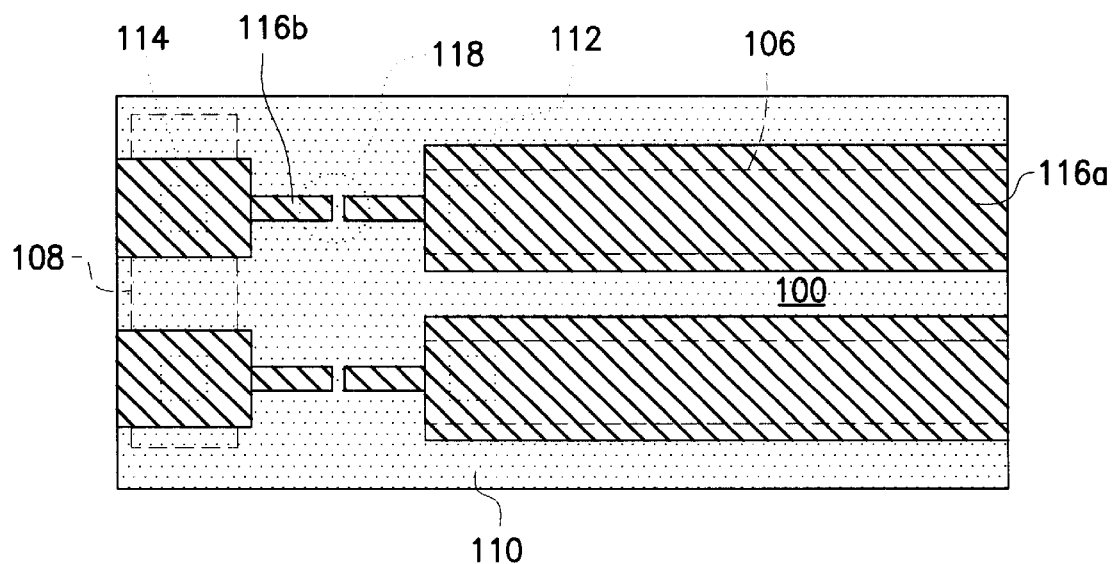
FIG. 2 illustrate a top view of the non-volatile memory shown in FIG. 1C.

Refer to FIG. 2 and FIG. 1C to further understand the structure of the non-volatile memory according to the preferred embodiment of this invention, wherein FIG. 2 illustrate a top view of the non-volatile memory shown in FIG. 1C.

As that shown in FIG. 2 and FIG. 1C, the word-line 106 is disposed on the substrate 100, the grounding doped region 108 is formed in the substrate 100, and the charge trapping layer 104 is located between the word-line 106 and the substrate 100. The contact 112 and the contact 114 are located in the dielectric layer 110 electrically connecting with the word-line 106 and the grounding doped region 108, respectively. In addition, the protective metal line 116b electrically connects the word-line 106 and the grounding doped region 108 via the contacts 112 and 114. The protective metal line 116b shown in FIG. 2 is narrower than the word-line 106 in order to have a high resistance, however, the protective metal line can be alternatively thinner than the word-line 106 for the same purpose. When the manufacturing process is completed, a large current is applied to blow the protective metal line 116b to disconnect the word-line 106 from the grounding doped region 108.

Since this invention uses a protective metal line to connect the substrate and the word-line, the charges produced in a plasma process can be conducted into the substrate. It is noted that the charges are produced in a small amount despite that the plasma environment has a relative high voltage level, so that the current formed from the charges is small and the protective metal line will not be blown. Therefore, the charge trapping layer of the non-volatile memory is not damaged and the memory cells are not programmed at random.

Moreover, since the protective metal line has a high resistance, it can be easily blown by applying a large current to disconnect the word-line from the substrate when the manufacturing process is completed. Consequently, the input voltage of the memory device is not lowered and the operating speed of the memory device is not decreased.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a non-volatile memory, comprising the steps of:

forming a non-volatile memory cell on a substrate;

forming a grounding doped region in the substrate;

forming a first contact on the substrate electrically connecting with the rounding doped region;

forming a second contact on the substrate electrically connecting with a word-line of the non-volatile memory cell;

forming a protective metal line having a first resistance higher than a second resistance of the word-line over the substrate, wherein the protective metal line is electrically connected with the grounding doped region via the first contact and is electrically connected with the word-line via the second contact; and applying a large current to blow the protective metal line.

2. The method of claim 1, wherein forming the protective metal line comprises:

forming a metal layer over the substrate; and patterning the metal layer to form the protective metal line.

3. The method of claim 1, wherein forming the non-volatile memory cell comprises:

forming a charge trapping layer on the substrate;

forming a polysilicon layer on the charge trapping layer;

forming a metal silicide layer on the polysilicon layer; and patterning the metal silicide layer, the polysilicon layer and the charge trapping layer to form the word-line.

4. The method of claim 3, wherein the charge trapping layer comprises a silicon oxide/silicon nitride/silicon oxide (ONO) composite layer.

5. The method of claim 3, wherein the metal silicide layer comprises tungsten silicide ($WSi_x$).

6. The method of claim 1, further comprising forming a dielectric layer over the substrate after the grounding doped region is formed in the substrate.

7. The method of claim 6, wherein the dielectric layer comprises borophosphosilicate glass.

* * * * *